United States Patent [19]

Hindermayr et al.

[11] 4,097,828
[45] Jun. 27, 1978

[54] TUNING UNIT WITH BANDSWITCH FOR HIGH FREQUENCY RECEIVERS

[75] Inventors: Martin Hindermayr, Aying; Ferdinand Wagner, Munich, both of Germany

[73] Assignee: Wilhelm Ruf KG, Munich, Germany

[21] Appl. No.: 735,714

[22] Filed: Oct. 26, 1976

[30] Foreign Application Priority Data

Nov. 6, 1975 Germany .............................. 2549781

[51] Int. Cl.² ................................................ H03J 5/32
[52] U.S. Cl. ........................................ 334/7; 74/10.85; 74/10.9; 334/15
[58] Field of Search ............ 334/7, 15; 74/10.9, 74/10.45, 10.6, 10.8, 10.85; 338/128, 129, 130, 131, 133; 325/459, 462

[56] References Cited

U.S. PATENT DOCUMENTS

| 3,508,176 | 4/1970 | Labude et al. .................. 325/459 X |
| 3,601,722 | 8/1971 | Rolf ................................... 74/10.8 X |
| 3,743,976 | 7/1973 | Meyer et al. ....................... 334/15 X |
| 3,846,732 | 11/1974 | Labude et al. ....................... 334/7 X |

*Primary Examiner*—Paul L. Gensler
*Attorney, Agent, or Firm*—Burgess, Dinklage & Sprung

[57] ABSTRACT

A tuning unit with a bandswitch for high frequency receivers having a potentiometer system for the control of capacity diodes is disclosed. The potentiometer system includes a plurality of parallelly disposed resistance paths on which wipers can be moved by means of screw tuning spindles mounted beside one another in a common housing made of an insulating material. The bandswitch is formed of metal wires and is associated with each tuning spindle. The tuning spindles are joined for rotation with sleeves simultaneously forming the operating knobs which are carried in apertures in the front plate and each have a flange engaging the back side of the front plate about the apertures. The flange is slightly larger than the cross section of the apertures and tapers conically away from the back side of the front plate.

12 Claims, 10 Drawing Figures

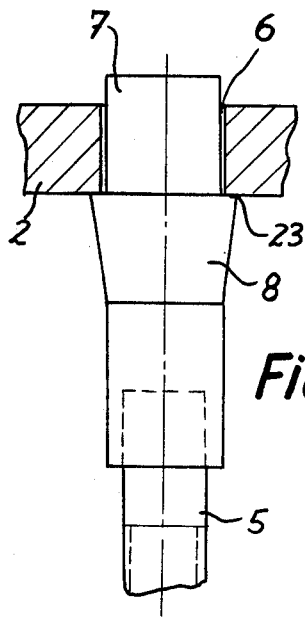
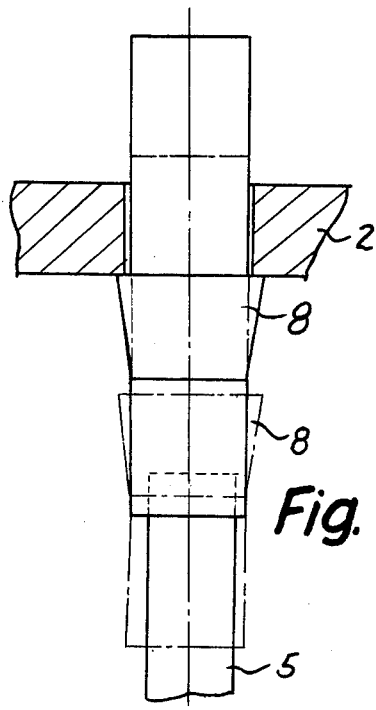
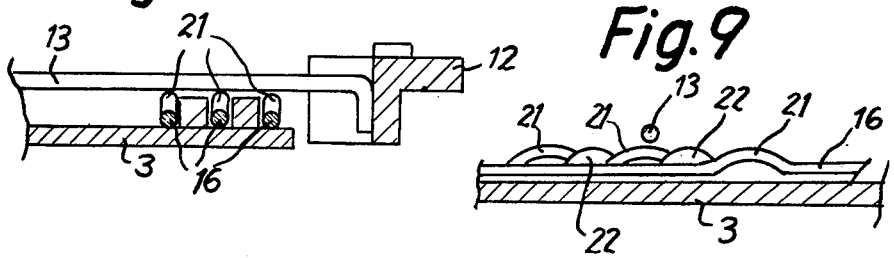
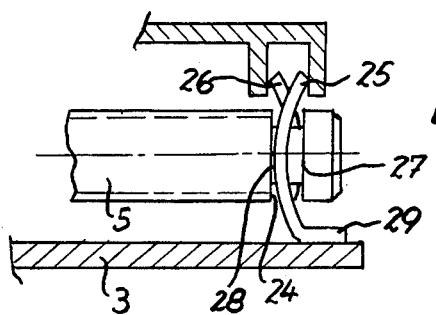

TUNING UNIT WITH BANDSWITCH FOR HIGH FREQUENCY RECEIVERS

BACKGROUND

The invention relates to a tuning unit with bandswitch for high frequency receivers, especially radio and television receivers, having a potentiometer system for the control of capacity diodes, the said potentiometer system consisting of a plurality of parallel resistance paths along which wiper contacts can be driven by means of screw spindles disposed adjacent one another in a common insulating material housing in which a bandswitch formed of metal rods is associated with each tuning spindle.

In these tuning units, the working voltages of the capacity diodes in the tuning circuits are recorded once a precise tuning to the desired frequency has been performed. A potentiometer tuning system has great advantages over the formerly used channel selectors operating with mechanically adjustable capacitors (tuning condensers) or mechanically adjustable inductances (variometers), mainly because it is not required to have such great precision in its tuning mechanism.

Tuning units with bandswitches formed of variable resistances and combined with interlocking pushbuttons controlling the supply of recorded working voltages to capacity diodes are known. Channel selection is accomplished by depressing the knobs, and the tuning or fine tuning are performed by turning the knobs. The resistances serving as voltage dividers in these tuning units are combined into a component unit such that they are in the form of a ladderlike pattern on a common insulating plate forming the cover of the housing in which the tuning spindles and wiper contacts corresponding to the variable resistances are housed. The number of resistances corresponds to the number of channels or frequencies which are to be recorded. The wiper contact picks up a voltage which, when applied to the capacity diodes determines their capacitance and hence the frequency of the corresponding oscillating circuit. The adjustment of the wipers is performed by turning the tuning spindle coupled to the tuning knob. By the depression of a button the electrical connection between a contact rod and a tuning spindle is brought about and thus the selected voltage is applied to the capacity diodes. Since the push buttons release one another, it is possible simply by depressing another button to tune to a different receiving frequency or a different channel, as the case may be.

To permit the switching of a number of channels in a certain tuning range, bandswitches for a plurality of tuning ranges, such as UHF and VHF for example, are often provided in the tuning units described above. In the pushbutton tuning unit of the above-named type, the bandswitch consists of a printed circuit board which is fastened on the housing of the tuning unit, and a switch lever which is preset by means of the pushbutton by turning, and is operated by depressing the pushbutton while at the same time selecting the channel.

Where this combination of knobs and pushbuttons is not possible, the selection of the range is accomplished by means of an additional lever which can be set over to select the range.

However, since such tuning units require too many riveting operations when they are assembled, tuning units were later created in which the individual parts in the voltage divider and pushbutton housing were loosely inserted and/or held in place by projections, lugs, hooks or tabs of resilient plastic. In spite of these initial improvements, the bandswitch, especially the one associated with the tuning units, was still technically intricate and very expensive.

THE INVENTION

It is the object of the invention, therefore, to create an additionally improved and simplified tuning unit containing a bandswitch of simple, space-saving and reliably operating design.

In accordance with the invention, this object is accomplished in a tuning unit with bandswitch of the kind described in the beginning by joining the tuning spindles for rotation with sleeves simultaneously forming the control knobs, which are mounted in apertures in the front plate of the housing and have each a flange engaging the back of the front plate around the aperture, the said flange being slightly larger than the aperture and tapering conically away from the back of the front plate.

In further development, the sleeves can be joined telescopically for rotation with the tuning spindles, and the flange is able to engage the back side of the front plate when the sleeve is in the position in which it is drawn out of the front plate. The sleeves constructed in this manner, whose portions projecting from the apertures in the front plate form the control knobs for the tuning spindles, permit easy assembly of the tuning unit and at the same time assure positive co-rotation of sleeves and spindles. The sleeves can be pushed from the front side of the front plate through the apertures onto the clutch surfaces of the spindles, this inward pushing being easily accomplished on account of the taper, and the dropping out of the sleeve being prevented by the flange engaging the back of the front plate. If the control knobs project only slightly out of the front plate, they can be operated from the outside by inserting a tool into them. With the telescoping type of coupling, however, it is possible to draw the sleeves or control knobs further outwardly so that they can be rotated by hand without the use of tools.

To provide constant assurance of the axial fixation of the tuning spindles, the tuning spindle ends farthest from the front plate can each be provided with an annular groove engaged by a spring bracket whose one leg is supported against the housing and whose other leg is forked to form two spring arms, each bent in the opposite direction and each engaging one of the two opposite walls of the annular groove. The tuning spindles are secured against axial displacement by this construction of the invention alone, without the need for further measures. This facilitates the joining of the sleeves or control knobs to the tuning spindle, because in this case there is no need for precise axial fixation and extreme dimensional accuracy.

Furthermore, the indicators associated with each potentiometer can be mounted in windows in the front plate which are associated with each tuning spindle or tuning knob for visual indication at the front, the other extremities farthest from the front plate being mounted for pivoting on pins set in the housing; the guiding pin on the spindle nut that is driven longitudinally on each tuning spindle can be provided with a slit disposed parallel to the long axis of the tuning spindles and can slide within the indicator slide lever slot, with its surface resiliently engaging the walls of said slot.

In an especially advantageous embodiment, the tuning unit can have bandswitches each formed of a displaceable metal rod which is in contacting engagement individually with stationary metal rods which are common to all of the bandswitches of a tuning unit. It contrast to the bandswitches known hitherto, which as a rule consist of a printed circuit board with switchable contacts thereon, this frequency bandswitch of the invention is of great simplicity, can be manufactured simply and inexpensively, and at the same time is very reliable in operation.

The displaceable and stationary metal rods of the bandswitches can be formed of metal wires or they can be of stamped sheet metal. Also, in further expansion of the concept of the invention, the stationary metal rods thus formed can be all entirely alike and merely offset from one another, thereby further simplifying the manufacture and stocking thereof.

To permit connection also to audiovisual apparatus, one or more of the stationary metal rods can be divided electrically into at least two parts each.

In a special development of this concept, lugs of insulating material can be mounted on the front ends of the displaceable metal wires, these lugs extending through windows in the front plate of the housing which are associated with each tuning spindle and are provided with detents, while the opposite ends can be held fixedly at the rear end of the housing, and the displaceable metal wires can make contact with contact humps on the stationary metal wires, the humps being offset from one another to correspond to the detents in the windows, and the stationary metal wires extending in back of the front plate, parallel to the latter and parallel to one another.

To increase switching reliability, bridges or sliding pieces made of insulating material can be inserted between the contact humps of adjacent stationary wires within the free space between two such parallel lying metal wires.

To achieve easy displacement of the displaceable metal wires despite the fixed end mounting on the housing, the displaceable metal wires, in further embodiment of the invention, can have each an articulation adjacent their end mountings, in the form of a vertically disposed flattened portion. This flat permits the metal wires to be deflected horizontally against a weak spring bias.

DESCRIPTION OF THE DRAWING

As an example of the embodiment of the invention, there is represented in the drawings a tuning unit with bandswitch for television receivers. In these drawings, FIG. 6 shows the sleeve with the operating knob and tuning spindle, FIG. 7 shows the telescoping manner in which the sleeve is joined to the tuning spindle, FIG. 8 is a fragmentary view of the bandswitch, FIG. 9 is another fragmentary view of the bandswitch, and FIG. 10 shows how the tuning spindle is fixed in position.

DESCRIPTION

Figure 1:
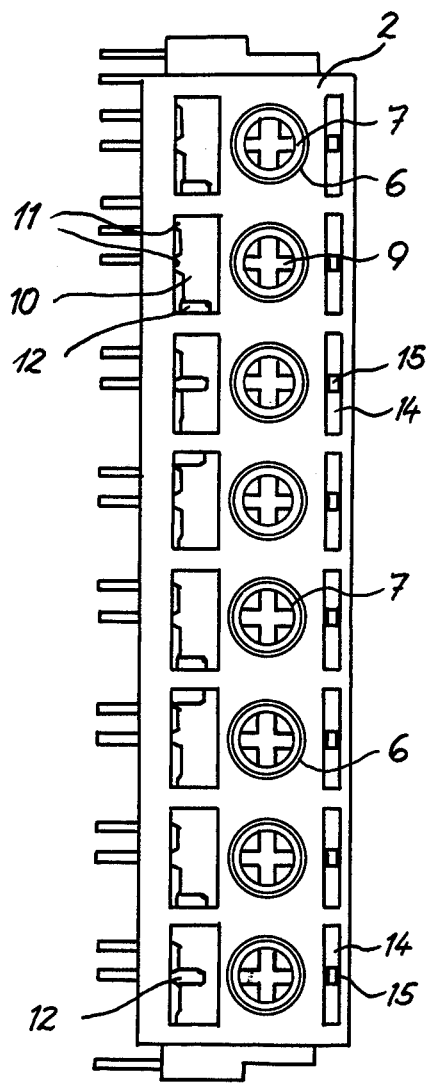
FIG. 1 is a front elevational view of a tuning unit with bandswitch.
Figure 2:
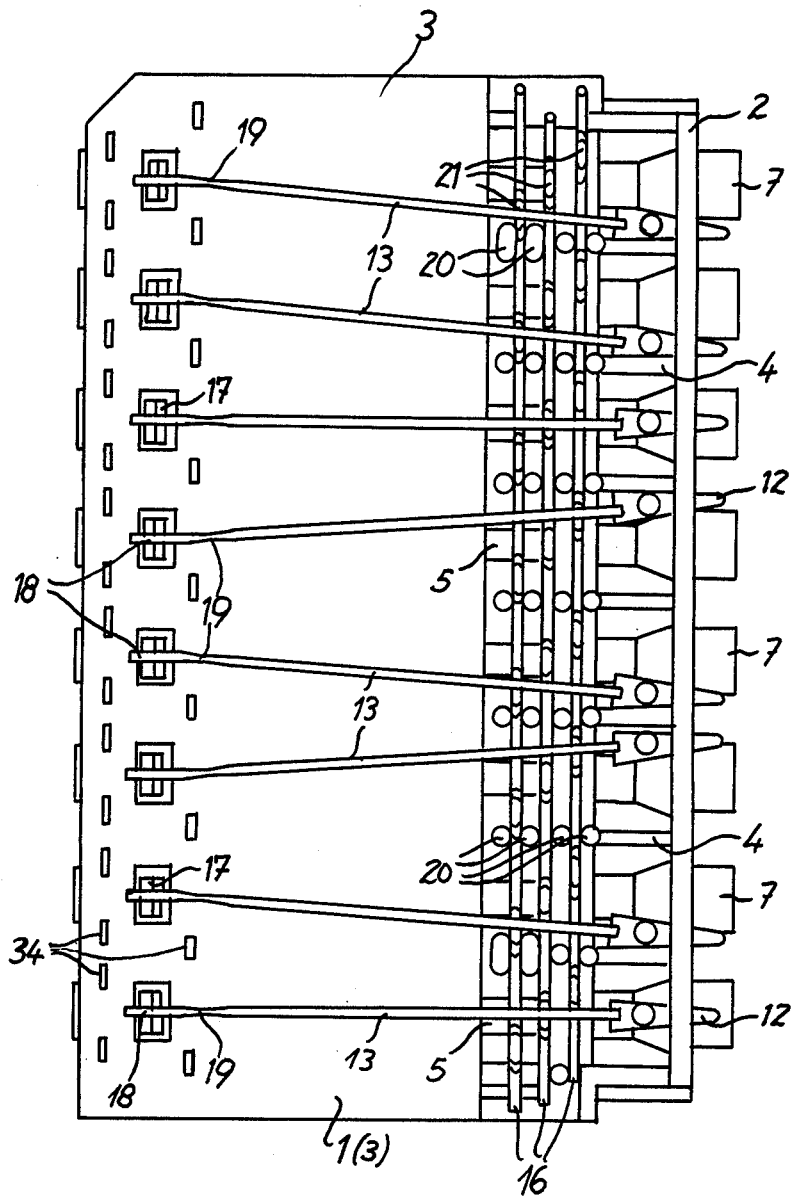
FIG. 2 is a plan view showing the bandswitch of the tuning unit of FIG. 1.
Figure 3:
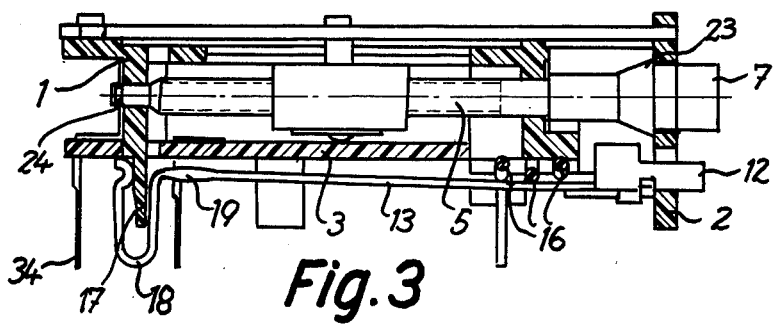
FIG. 3 is a side elevational, cross-sectional view of the tuning unit of FIG. 1.
Figure 4:
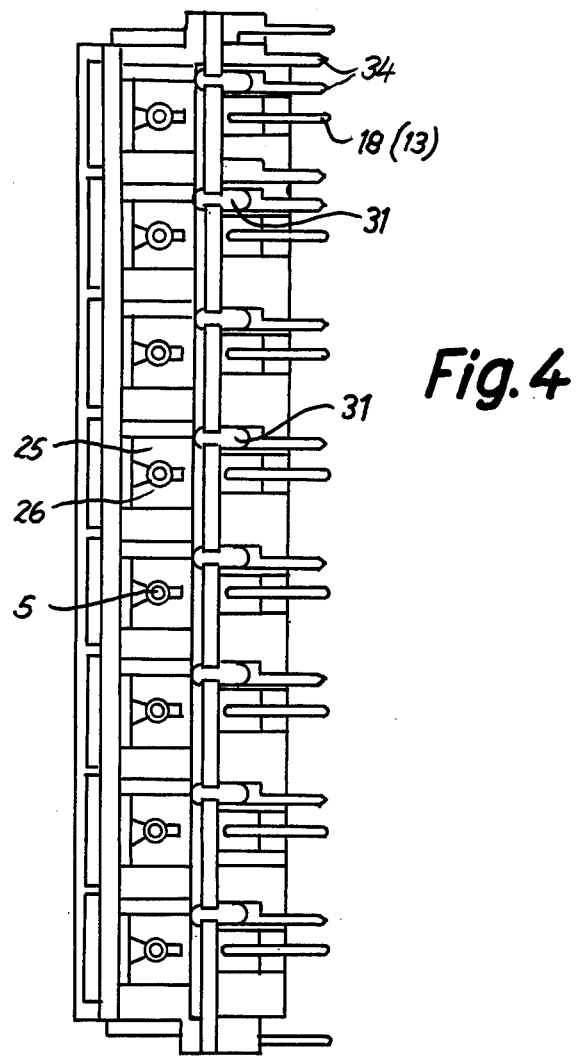
FIG. 4 is a rear elevational view of the tuning unit of FIG. 1.
Figure 5:
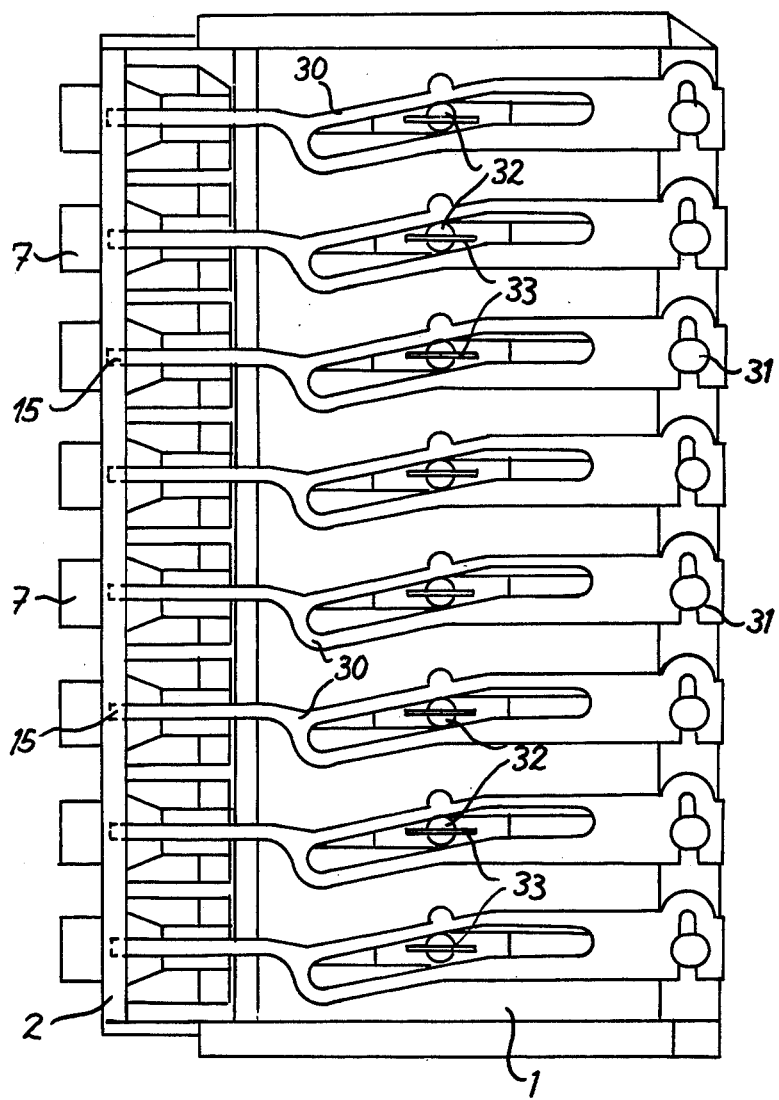
FIG. 5 is a plan view showing the indicator means of the tuning unit of FIG. 1.

The method of representation used in the drawings is greatly simplified, for the purpose of better delineating the features of the invention. The tuning unit with bandswitch consists of an insulating material housing 1 with a front plate 2, which is closed by a cover plate 3 accommodating the resistance paths. The housing 1 is divided by parallel sidewalls 4 into chambers in which the tuning spindles 5 are disposed.

The embodiments is an 8-fold tuning unit having eight bandswitches assocated with each tuning spindle, and eight indicators.

Accordingly, there are eight apertures 6 in a central row, through which the operating knobs 7 of the sleeves 8 coupled with the tuning spindles 5 are passed. The operating knobs 7 have recessed surfaces 9 for turning with a turning tool. In a row extending parallel above the row of the apertures 6 there are eight windows 10, whose upper edge is provided with notches 11. Lugs 12 of insulating material extend through the windows 10 and engage the upper notches 11 and are joined behind the front plate to displaceable metal wires 13 of the bandswitch. In a row located beneath the row of apertures 6 another eight windows 14 are provided, through which the ends of the pointers of the indicators 15 protrude.

Now, the bandswitch consists in each case of a displaceable metal wire 13 which can be brought into working engagement with stationary metal wires 16, which are all of the same construction and are only disposed offset from one another. While the displaceable metal wire 13 extends substantially parallel to the longitudinal axis and thus at right angles to the front plate 2, the stationary, parallelly disposed metal wires 16 are parallel to the front plate 2 and are thus inserted at a right angle to the displaceable metal wire. A departure from parallelism or from the right angle, as the case may be, takes place substantially only when the displaceable metal wire 13 is deflected to the two outer notches. The rearward end 18 of the displaceable metal wire, which forms a vertical loop, is tightly inserted into a receiver 17. Just ahead of the loop 18, the metal wire 13 is provided with a vertically disposed portion 19 by a flattening on the metal wire 13. The movement, when the metal wire 13 is deflected into the desired notches or detents, takes place horizontally by the flexing of these portions 19. The stationary metal wires 16 are held tightly in their positions in projections 20 on the housing, or by lugs or the like. Since three switch actions are provided, that is, three ranges, for each tuning spindle, a bandswitch consists of one displaceable metal wire and three stationary metal wires 16, which are used for all switches.

To permit each bandswitch to have exactly three switching actions, each of the three stationary metal wires 16 has one contact hump 21 corresponding to one of the detents 11 in the windows 10 of the front plate 2. The contact humps 21 are thus located one next to the other as seen from the front plate 2. So that the displaceable metal wire 13 will always come into mechanical and electrical contact only with the desired contact hump, and prevent short circuits, insulating bridges 22 are installed between the adjacent metal wires 16, said insulating bridges being stationary.

If more or less than three switching actions are desired, all that need be done in the case of the bandswitch of the invention is to change the number of stationary metal rods or wires accordingly.

The sleeves 8 with the operating knob 7 have a flange 23 engaging the back of the front plate 2 and tapering back to the point where it joins the tuning spindle. This enables the sleeves to be pushed in, in the case of a housing that has already been manufactured with the tuning spindle installed, without creating the possibility that the sleeves 8 might escape after they have been inserted. The sleeves 8 are connected to the tuning spindles 5 usually by means of driving surfaces. If manual operation without tools is to be possible, rather than requiring a tool for the operation of the sleeves, the coupling of the sleeve 8 to the tuning spindle will be a telescoping coupling (see FIG. 7).

The actual firm axial fixation of the tuning spindle 5 is located on the rear end of the housing. Here the tuning spindle 5 has an annular groove 24 which is engaged by a spring by means of two diametrically disposed spring arms 25 and 26. The spring arms 25 and 26 have oppositely curved lugs and are supported on the housing at their terminal and marginal surfaces and their lugs engage opposite axial walls 27 and 28 of the annular groove 24.

Additional support is provided by the common, bent foot 29 of the spring arms 25 and 26 against the cover plate of the housing.

The indicator means of the tuning unit with bandswitch consists of a pointer 15 which is movable within the window 14, and a cam 30 which is a prolongation of the pointer 15. At its rearward end, the pointer is mounted rotatably in the housing on pin 31. Within the cam 30 slides a guiding pin 32 which is attached to the spindle nut or carriage 40. Upon the rotation of the tuning spindle, the spindle nut is longitudinally displaceable therewith. In order to achieve good guidance and hence precise indication, the guiding pin has a slit 33 extending parallel to the longitudinal axis of the tuning spindle 5, so that it will resiliently engage the cam 30 within the slot thereof.

The necessary soldering lugs are indicated at 34.

On the basis of the design of the tuning unit with bandswitch in accordance with the invention, a desired frequency range—UHF, for example—can be selected by deflecting a displaceable metal wire 13 into one of the detents 11 by means of the lug 12 mounted thereon. Within this range, a transmitter or channel can then be selected by turning the tuning spindle 5. The transmitter preselected in this manner can then be tuned in by means of a keyboard or by electronic recall from a keyboard which is not shown. The fine tuning of this tuned-in transmitter, as well as the selection of a different transmitter within the same frequency range, is accomplished by turning the tuning spindle 5.

All of the details explained in the above description and represented in the drawings are important to the invention.

What is claimed is:

1. Tuning unit with bandswitch for high frequency receivers having potentiometer means for the control of capacity diodes composed of a plurality of parallelly disposed resistance paths on which wipers are moved by means of screw tuning spindle means mounted beside one another in a common housing of insulating material, bandswitch means formed of metal wires associated with each tuning spindle means, said tuning spindle means being joined for rotation with sleeve means simultaneously forming operating knobs which are borne in apertures in the front plate and each sleeve means having an axial flange surface engaging the back side of the front plate about one aperture therein, said flange surface being slightly larger than the cross section of the apertures and tapering conically away from the back side of the front plate.

2. Tuning unit of claim 1 wherein the sleeve means are joined telescopically and coaxially with the tuning spindle means, and the flange surface engages the back side of the front plate when the sleeve means are in the state wherein they are pulled out of the front plate.

3. Tuning unit of claim 1 wherein the ends of the tuning spindle means which are opposite the front plate have each an annular groove into which a spring bracket engages whose bent end is supported against the housing and which has two diametrically disposed spring arms having opposite spring curvature, the said spring arms in each case contacting the opposite axial walls of the groove.

4. Tuning unit of claim 3 wherein the spring bracket rests with its bent end against the housing and the spring arms additionally engage a bracket formed on the housing or an intermediate bracket formed in one piece with the connection soldering lugs.

5. Tuning unit of claim 3 wherein the spring bracket is formed in one piece with the connection soldering lugs and has spring arms curved both in the same direction which engage an axial wall of the annular groove in the spindle and the opposite axial wall rests against a housing wall.

6. Tuning unit of claim 1 wherein the pointers associated with each potentiometer means lie on the one hand in windows associated with each tuning spindle means in the front plate, and on the other hand are rotatably mounted with their ends opposite the front plate in pivot pins on the housing, and the guiding pin of the spindle nuts carried in a longitudinally displaceable manner on each tuning spindle is provided with a slit disposed parallel to the longitudinal axis of the tuning spindle and slides with its peripheral surface resiliently within the slide tract of the pointer.

7. Tuning unit of claim 1 wherein the bandswitches are formed each of a displaceable metal rod which is in working engagement with stationary metal rods common to all bandswitches of a tuning unit, contacting each of them individually.

8. Tuning unit of claim 7 wherein the metal rods are metal wires.

9. Tuning unit of claim 7 wherein the metal rods are stamped metal parts.

10. Tuning unit of claim 7 wherein levers of insulating material are placed on the front ends of the displaceable metal rods and extend through windows which are provided with detents and which are associated with each tuning spindle in the housing front plate, while the opposite ends are held fixedly in the rearward end of the housing, and the displaceable metal rods individually make contact with contact cams on the stationary metal rods, these cams being in an offset array corresponding to the detents in the windows, the corresponding rods extending parallel to the front plate and parallel to one another behind the front plate.

11. Tuning unit of claim 7 wherein insulating material bridges or insulating material slide pieces are inserted between the contact cams of two adjacent, stationary metal rods and within the free space between two such parallel metal rods.

12. Tuning unit of claim 7 wherein the displaceable metal rods have, in the vicinity of their mountings on the housing, an articulation in the form of a vertically disposed flat portion.

* * * * *